(12) United States Patent
Chan et al.

(10) Patent No.: US 8,020,127 B1
(45) Date of Patent: Sep. 13, 2011

(54) CLOCK FREQUENCY EXPLORATION FOR CIRCUIT DESIGNS HAVING MULTIPLE CLOCK DOMAINS

(75) Inventors: Chi Bun Chan, San Jose, CA (US); Jingzhao Ou, Sunnyvale, CA (US); Jeffrey D. Stroomer, Lafayette, CO (US)

(73) Assignee: Xilinx, Inc., San Jose, CA (US)

( * ) Notice: Subject to any disclaimer, the term of this patent is extended or adjusted under 35 U.S.C. 154(b) by 356 days.

(21) Appl. No.: 12/275,658

(22) Filed: Nov. 21, 2008

(51) Int. Cl.
G06F 9/455 (2006.01)
G06F 17/50 (2006.01)

(52) U.S. Cl. ......... 716/108; 716/106; 716/132; 716/104

(58) Field of Classification Search .................. 716/134, 716/108
See application file for complete search history.

(56) References Cited

U.S. PATENT DOCUMENTS

| | | | |
|---|---|---|---|
| 6,763,506 B1 * | 7/2004 | Betz et al. | 716/108 |
| 2005/0120318 A1 * | 6/2005 | Goko et al. | 716/6 |

OTHER PUBLICATIONS

Clarke, Edmund; Kroening Daniel; Yorav, Karen; "Specifying and Verifying Systems with Multiple Clocks," Oct. 1, 2003, Carnegie Mellon University.*
Sirowy, Scott; Wu, Yonghui; Lonardi, Stefano; Vahid, Frank; "Clock-Frequency Assignment for Multiple Clock Domain Systems-on-a-Chip," Apr. 16, 2007, Design, Automation & Test in Europe Conference and Exhibition.*

* cited by examiner

*Primary Examiner* — Nghia Doan
*Assistant Examiner* — Eric Lee
(74) *Attorney, Agent, or Firm* — Kevin T. Cuenot; LeRoy D. Maunu; Thomas George (57) ABSTRACT

A computer-implemented method of circuit design can include receiving clock frequency constraints defining relationships between clock frequencies of a plurality of clock domains of a circuit design specified within a high-level modeling system (305) and receiving a cost function that is dependent upon the clock frequencies of the plurality of clock domains (310). A feasibility result can be determined according to the clock frequency constraints and the cost function (315). The feasibility result can indicate whether a clock frequency assignment exists that specifies a clock frequency for each of the plurality of clock domains that does not violate any clock frequency constraint. The feasibility result can be output (315).

19 Claims, 2 Drawing Sheets

CLOCK FREQUENCY EXPLORATION FOR CIRCUIT DESIGNS HAVING MULTIPLE CLOCK DOMAINS

FIELD OF THE INVENTION

The embodiments disclosed herein relate to integrated circuit devices (ICs). More particularly, the embodiments relate to developing a circuit design that includes multiple clock domains for implementation within an IC.

BACKGROUND OF THE INVENTION

Modern circuit designs implemented within ICs are typically partitioned into multiple clock domains. Each clock domain can operate at a different frequency according to the particular performance requirements of that circuit design. Part of the circuit design process includes determining the particular frequency at which each partition will operate while still ensuring the integrity and synchronization of any communications that move from one clock domain to another.

Presently, circuit designers manually determine the clock frequency of each clock domain of the circuit design. This entails a trial and error process where different frequencies for each clock domain are tested. Once a clock frequency is determined for each individual clock domain, the clock domains of the circuit design can be tested in combination. When the circuit design does not meet a design requirement, the designer manually adjusts the clock frequency of one or more domains and repeats the process. This can become a long and tedious endeavor even for circuit designs with few clock domains. While searching for a workable clock frequency for each clock domain, the designer remains unaware of whether a solution is actually feasible.

SUMMARY OF THE INVENTION

The embodiments disclosed herein relate to developing a circuit design that includes multiple clock domains for implementation within an integrated circuit. One embodiment of the present invention can include a computer-implemented method of circuit design including receiving clock frequency constraints defining relationships between clock frequencies of a plurality of clock domains of a circuit design specified within a high-level modeling system and receiving a cost function that is dependent upon the clock frequencies of the plurality of clock domains. A feasibility result can be determined according to the clock frequency constraints and the cost function. The feasibility result can indicate whether a clock frequency assignment exists that specifies a clock frequency for each of the plurality of clock domains that does not violate any clock frequency constraint. The feasibility result can be output.

The computer-implemented method can include selecting at least one clock frequency constraint to specify an allowable clock frequency range for at least one of the clock domains. The clock frequency range can be selected to be a closed frequency range or an open clock frequency range. The clock frequency range(s) also can be selected to specify an inter-clock domain dependency for clock frequencies of at least two of the plurality of clock domains.

When the feasibility result indicates that the circuit design is feasible, the method can include determining a clock frequency assignment specifying a clock frequency for each of the plurality of clock domains and outputting the clock frequency assignment. The computer-implemented method can include determining whether the circuit design meets at least one timing constraint. In another aspect, the method can include implementing the circuit design and determining whether the implemented circuit design meets at least one timing constraint.

The computer-implemented method also can include performing a timing check on the circuit design and determining that the circuit design does not meet at least one timing constraint, determining at least one new clock frequency constraint according to a result from the timing check, and determining feasibility of the circuit design using the clock frequency constraints, inclusive of the new clock frequency constraint, and the cost function.

The cost function can be defined to specify a priority among the plurality of clock domains. Determining a feasibility result can include solving a linear problem defined by the clock frequency constraints and the cost function by minimizing the cost function.

When the feasibility result indicates that the circuit design is not feasible, the method can include modifying at least one of the clock frequency constraints and determining a feasibility result according to the clock frequency constraints, inclusive of the at least one modified clock frequency constraint, and the cost function.

The computer-implemented method also can include first determining a maximum achievable clock frequency for at least one clock domain of the circuit design. One or more of the clock frequency constraints can be generated according to any maximum achievable frequencies determined for the clock domain(s).

Another embodiment of the present invention can include a computer-implemented method of circuit design including receiving clock frequency constraints for a plurality of clock domains of a circuit design, wherein the clock frequency constraints specify a linear programming problem defining inter-dependencies among clock frequencies of the plurality of clock domains. A solution for the linear programming problem can be determined. The solution can indicate feasibility of the circuit design according to whether a frequency exists for each of the plurality of clock domains that does not violate any of the clock frequency constraints. An indication of feasibility of the circuit design can be output.

The computer-implemented method can include determining whether clock frequencies calculated when determining a solution for the linear programming problem violate timing constraints for the circuit design. Feasibility of the circuit design further can depend upon whether the solution for the linear programming problem violates the timing constraints.

Solving the linear programming problem can include minimizing a cost function that depends upon the clock frequency constraints. In another aspect, the method can include assigning priorities among the clock domains within the cost function, wherein each clock domain contributes to a cost determined using the cost function according to the priority assigned to that clock domain.

Yet another embodiment of the present invention can include a computer program product including a computer-usable medium having computer-usable program code that, when executed by a data processing system, causes the data processing system to perform the various steps and/or functions disclosed herein.

DETAILED DESCRIPTION

While the specification concludes with claims defining the features of the invention that are regarded as novel, it is believed that the invention will be better understood from a consideration of the description in conjunction with the drawings. As required, detailed embodiments of the present invention are disclosed herein; however, it is to be understood that the disclosed embodiments are merely exemplary of the invention, which can be embodied in various forms. Therefore, specific structural and functional details disclosed herein are not to be interpreted as limiting, but merely as a basis for the claims and as a representative basis for teaching one skilled in the art to variously employ the inventive arrangements in virtually any appropriately detailed structure. Further, the terms and phrases used herein are not intended to be limiting but rather to provide an understandable description of the invention.

The embodiments disclosed herein relate to determining clock frequencies for clock domains of a multi-clock domain circuit design to be implemented within an integrated circuit (IC). In accordance with the embodiments disclosed herein, a multi-clock domain circuit design can be specified within a high-level modeling system (HLMS) for circuit design. One or more clock frequency constraints can be specified for the different clock domains. Clock frequencies for the different clock domains can be explored automatically in accordance with the defined clock frequency constraints and any timing constraints specified for the circuit design. A result can be determined that indicates, given the clock frequency constraints and/or the timing constraints, whether the circuit design is feasible. When feasible, a clock frequency assignment that specifies a clock frequency for each of the clock domains can be determined.

A "high-level modeling system" or "HLMS," as used within this specification, refers to a computer-based circuit design tool. Typically, an HLMS provides a graphical design environment in which designers can visually create systems through a drag-and-drop type of design approach. The various visual objects that are dragged into the visual design environment represent circuit functions, such as multiplexers, adders, filters, or the like. Each visual object represents the circuit functionality as well as various models that may be used for simulating the circuit design being developed.

In general, a circuit design specified within an HLMS will be portable to any of a variety of different IC architectures. The level of abstraction provided by the HLMS allows the same system to be implemented within these different architectures. Another aspect of an HLMS is that circuit designs specified within such a system can include different hierarchical levels. Blocks used within the HLMS can be configured and adjusted according to this hierarchy. For example, a change to one block can be propagated downstream through the hierarchy automatically.

One example of an HLMS is the Xilinx System Generator for Digital Signal Processing (DSP), also known as "SysGen." Simulink, which runs in MATLAB from The Math Works, Inc., of Natick, Mass., is an interactive tool for modeling, simulating, and analyzing dynamical systems. SysGen is a high-performance design tool that executes as part of Simulink to provide a high-level, graphical modeling environment.

Circuit designs created within an HLMS can be output as a circuit description. That circuit description can be a programmatic circuit description specified in any of a variety of different formats. For example, the circuit description can be formatted in mcode or another native format utilized by the HLMS, as one or more hardware description language files, as a netlist, or the like. The circuit description further can be processed and translated, e.g., synthesized, placed, mapped, routed, and/or converted, into a bitstream that can be loaded into a fully or partially programmable IC to configure the IC to implement the multi-clock domain circuit design. As used herein, "outputting" and/or "output" can mean, for example, writing to a file, writing to memory, storing in memory, writing to a user display or other output device, sending or transmitting to another system, exporting, or the like.

The embodiments described within this specification can be applied to multi-clock domain circuit designs that are to be implemented within ICs as well as programmable ICs. In general, programmable ICs refer to a type of IC that can be programmed to perform specified logic functions. One type of programmable IC, the field programmable gate array (FPGA), typically includes an array of programmable tiles. These programmable tiles can include, for example, input/output blocks (IOBs), configurable logic blocks (CLBs), dedicated random access memory blocks (BRAM), multipliers, digital signal processing blocks (DSPs), processors, clock managers, delay lock loops (DLLs), and so forth.

Each programmable tile typically includes both programmable interconnect and programmable logic. The programmable interconnect typically includes a large number of interconnect lines of varying lengths interconnected by programmable interconnect points (PIPs). The programmable logic implements the logic of a user design using programmable elements that can include, for example, function generators, registers, arithmetic logic, and so forth.

Other varieties of programmable ICs can include complex programmable logic devices (CPLDs), programmable logic arrays (PLAs), programmable array logic (PAL) devices, For all of these programmable ICs, the functionality of the device is controlled by data bits provided to the device for that purpose. The data bits can be stored in volatile memory (e.g., static memory cells, as in FPGAs and some CPLDs), in nonvolatile memory (e.g., FLASH memory, as in some CPLDs), or in any other type of memory cell.

Other programmable ICs are programmed by applying a processing layer, such as a metal layer, that programmably interconnects the various elements on the device. These programmable ICs are known as mask programmable devices. Programmable ICs can also be implemented in other ways, e.g., using fuse or antifuse technology. The phrase "programmable IC" can include, but is not limited to, these devices, and further may encompass devices that are only partially programmable. For example, one type of programmable IC includes a combination of hard-coded transistor logic and a programmable switch fabric that programmably interconnects the hard-coded transistor logic.

Figure 1:
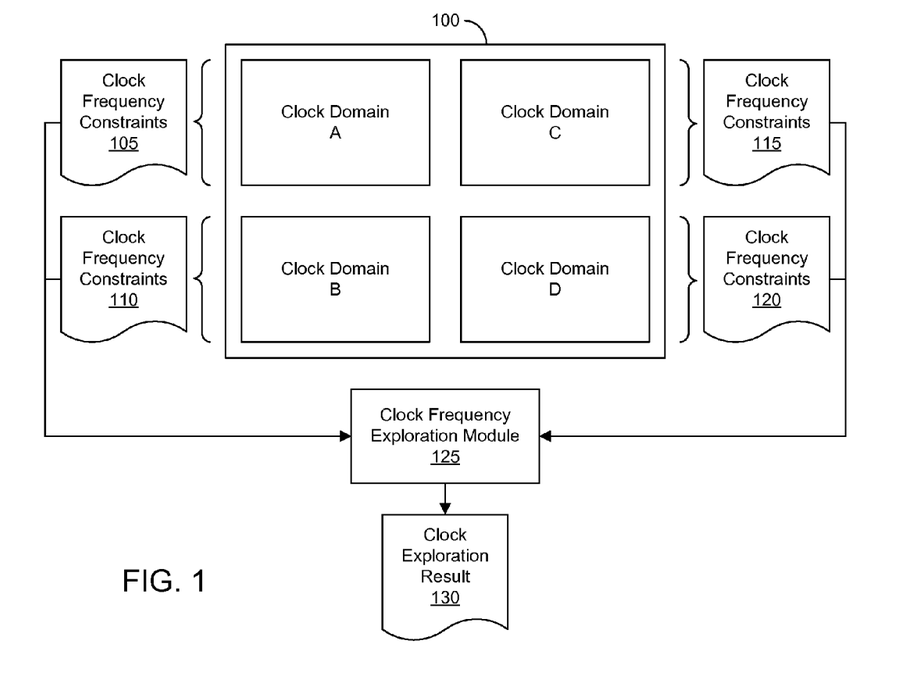
FIG. 1 is a block diagram illustrating a technique for determining clock frequencies for a circuit design including a plurality of clock domains in accordance with one embodiment of the present invention.

FIG. 1 is a block diagram illustrating a technique for determining clock frequencies for a circuit design including a plurality of clock domains in accordance with one embodiment of the present invention. Circuit design 100 can be specified in a programmatic form within an HLMS of the variety described within this specification. Circuit design 100 can be in a state where the circuit design has been specified at a high level and, therefore, has not yet been implemented, e.g., has yet to be synthesized, mapped, placed, or routed for a selected target IC.

In this example, circuit design 100 includes four different clock domains denoted as clock domain A, clock domain B, clock domain C, and clock domain D. It should be appreciated that the particular number of clock domains within a given circuit design is not intended to limit the embodiments presented within this specification. A circuit design with fewer than four or more than four clock domains may also be processed as described within this specification.

Each of the clock domains A, B, C, and D, can be associated with one or more clock frequency constraints. Clock domain A is associated with clock frequency constraints 105. Clock domain B is associated with clock frequency constraints 110. Clock domain C is associated with clock frequency constraints 115. Clock domain D is associated with clock frequency constraints 120. Each set of clock frequency constraints can be a user-specified collection of one or more constraints relating to the desired clock frequency of the corresponding clock domain.

Because the clock frequency constraints 105, 110, 115 and 120 are specified in the context of an HLMS, the different clock frequency constraints 105, 110, 115 and 120 are not tied to a particular hardware implementation of each respective clock domain. Each clock frequency constraint can be specified as one of a variety of different types of clock frequency constraints. The different types of clock frequency constraints can include fixed value clock frequency constraints, range clock frequency constraints, and relational expression clock frequency constraints.

A fixed value clock frequency constraint will explicitly specify a desired clock frequency for a given clock domain. In other words, the clock frequency for a given clock domain will be specified as a constant value. A range clock frequency constraint will specify an acceptable range of clock frequencies for a given clock domain. Range clock frequency constraints may be open or closed. An open clock frequency range constraint will leave either one or both of the upper or lower bounds of the range unspecified, e.g., "open." For example, a range clock frequency constraint having a specified lower bound and an unspecified upper bound indicates that the user desires the corresponding clock domain to run or operate at the highest possible frequency, while placing a specific limit on the slowest acceptable operating frequency of the clock domain. Relational expression clock frequency constraints can specify a dependency among two or more clock frequencies of different clock domains. That is, the clock frequency of one clock domain can be specified as a function of the clock frequency (or frequencies) of one or more or all other clock domains.

Whereas conventional methods of circuit design frequently ask the user to specify a particular operating frequency for a clock domain, the embodiments disclosed within this specification provide a foundation for exploring various operating frequency solutions. Moreover, conventional EDA tools typically deal with circuit designs that include only a single clock domain, while the embodiments described within this specification accommodate circuit designs with multiple clock domains.

For example, many conventional tools ask the user to specify a desired operating frequency and indicate whether or not the circuit design can achieve that frequency. The tools do not attempt to go beyond the user-specified and desired operating frequency. As an illustration, if a user specifies that 200 MHz is a desirable operating frequency for a circuit design, the HLMS may indicate that 200 MHz is attainable, but not provide any further information when, in fact, the circuit design may achieve a 400 MHz operating frequency. Within a conventional circuit design tool, going beyond the initial specified operating frequency requires that the user provide another operating frequency goal to the HLMS and repeat the process until the circuit fails to achieve that goal. Still, this "goal" and any intermediate frequencies tried by the designer during the development process are educated guesses as to what operating frequencies may be achieved as opposed to a systematic exploration technique for exploring possible operating frequencies.

Returning to FIG. 1, the clock frequency constraints 105, 110, 115 and 120 can be provided to a clock frequency exploration module (CFEM) 125. The CFEM 125 can process the different clock frequency constraints 105, 110, 115 and 120. As shown, the CFEM 125 can output a clock exploration result 130. In one embodiment, the clock exploration result 130 can indicate whether circuit design 100 is feasible. In other words, the CFEM 125 can determine whether each clock domain A, B, C, and D may be assigned a clock frequency that conforms to the clock frequency constraints 105, 110, 115 and 120. The inability to determine clock frequencies for each clock domain A, B, C, and D that comply with the clock frequency constraints 105, 110, 115 and 120 indicates an infeasible circuit design. If the circuit design 100 is feasible and a clock frequency assignment solution does exist, the CFEM 125 can specify a clock frequency assignment that assigns a clock frequency to each of clock domains A, B, C, and D that complies with the clock frequency constraints 105, 110, 115 and 120 and output that clock frequency assignment as part of clock exploration result 130.

Figure 2:
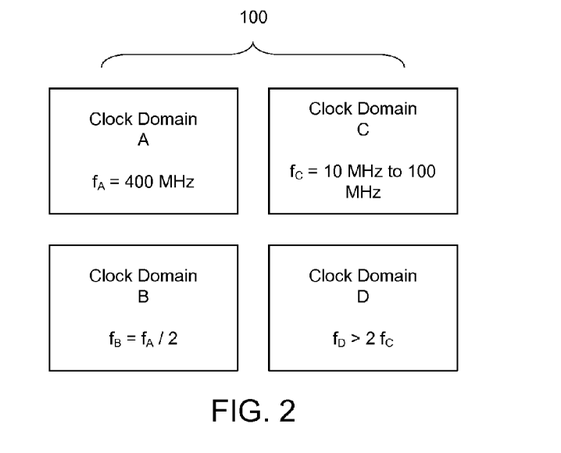
FIG. 2 is a second block diagram illustrating clock frequency constraints for the circuit design of FIG. 1 in accordance with another embodiment of the present invention.

FIG. 2 is a second block diagram illustrating clock frequency constraints for the circuit design of FIG. 1 in accordance with another embodiment of the present invention. FIG. 2 illustrates circuit design 100 pictured with example clock frequency constraints for each of clock domains A, B, C, and D. As shown, clock domain A has a fixed clock frequency constraint setting the clock frequency of clock domain A to 400 MHz. Clock domain B has a relational expression clock frequency constraint that states that the clock frequency of clock domain B is to be one-half of the frequency of the clock of clock domain A, e.g., 200 MHz.

Clock domain C has a range clock frequency constraint. The range clock frequency constraint is a closed range constraint indicating that clock domain C may have a clock frequency that is not less than 10 MHz and which does not exceed 100 MHz. Clock domain D is associated with another example of a relational expression clock frequency constraint. The clock frequency constraint for clock domain D specifies that the clock frequency of clock domain D is to be twice the clock frequency of the clock of clock domain C.

In one embodiment, the various clock frequency constraints can be reformulated into a linear programming problem. While observing the clock frequency constraints, for example, a cost function can be minimized. The cost function can be specified in terms of the clock frequencies and, thus, the clock frequency constraints. The linear programming problem can be solved to indicate whether the circuit design, given the clock frequency constraints, is feasible or infeasible.

A feasible solution indicates that a set of frequencies exists, e.g., a clock frequency assignment, that satisfies all of the clock frequency constraints. In cases where the solution is feasible, a clock frequency assignment can be determined that minimizes the cost function and specifies a clock frequency for each clock domain that does not violate the clock frequency constraints for that clock domain. An infeasible solution indicates that there is no set of frequencies that satisfies the clock frequency constraints. An infeasible solution indicates that the circuit design is not feasible given the current set of clock frequency constraints.

The clock frequency constraints illustrated within clock domains A, B, C, and D, for example, can be formulated into a linear programming problem as demonstrated below.

$$f_A=400;$$

$$f_B=f_A/2;$$

$$10 \leq f_C \leq 100;$$

$$f_D>2f_C;$$

$$f_A,f_B,f_C,f_D>0; \text{ and}$$

$$f_A,f_B,f_C,f_D<500$$

The above constraints are taken from FIG. 2. Appreciably, any clock frequency will be greater than zero and smaller than the maximum frequency limit of the target IC, in this case 500, where each of the numerical values is indicated in MHz.

One example of a cost function that can be used in solving the linear programming problem can be $C=p_A/f_A+p_B/f_B+p_C/f_C+p_D/f_D$, where C represents the cost of a given solution with clock frequencies $f_A$, $f_B$, $f_C$, and $f_D$ being assigned to clock domains A, B, C, and D respectively. The goal is to minimize the cost C. The term $p_N$ can represent a priority that a user may assign to each clock domain. While a priority may be specified in any of a variety of different ways, in this example, the lower the value of $p_N$, the more significant or important the corresponding $f_N$. More significant $f_N$ will increase the value of C to a lesser degree than those $f_N$ of lesser importance that are associated with greater values of $p_N$. Accordingly, those $f_N$ of greater importance and, thus, lower $p_N$, will have a "greater" contribution to the value of C in terms of minimizing the cost C.

It should be appreciated that other cost functions can be used. For example, the above cost function can be rewritten in the form of $$C = \frac{1}{p_A f_A + p_B f_B + p_C f_C + p_D f_D},$$

where priorities $p_N$ will be higher for more important $f_N$ and lower for lesser important $f_N$.

The linear programming problem can be solved using any of a variety of commercially available linear programming solvers (LPSs). An LPS is a computer-program that executes within a computer system. Given a cost function and the linear constraints, e.g., clock frequency constraints, as input, the LPS can determine a solution that specifies a feasibility result. The feasibility result indicates whether the circuit design is feasible or infeasible. When feasible, a clock frequency assignment can be output. Any clock frequency assignment generated can be evaluated in terms of timing by the HLMS for critical paths to ensure that feasible solutions determined using linear programming will also be feasible in terms of timing, e.g., not violate timing constraints for the circuit design.

Accordingly, the CFEM 125, as described with reference to FIG. 1, for example, can include an LPS executing cooperatively with an HLMS. For example, the LPS can be implemented as a component or a plug-in within the HLMS. In another example, the two programs can be implemented as a single larger program capable of performing HLMS functions and LP solving functions. This does not preclude the situation in which the two programs exist independently of one another and communicate with one another to perform the functions described herein. In any case, the system, e.g., the CFEM 125, can determine whether a circuit design is feasible given clock frequency constraints, determine a frequency assignment for the clock domains when the circuit design is feasible, and further determine whether the circuit design can be implemented without violating other timing constraints that may be specified for the circuit design. The flow chart to follow illustrates various techniques for determining a clock frequency assignment for a multi-clock domain circuit design in accordance with the embodiments disclosed herein.

Figure 3:
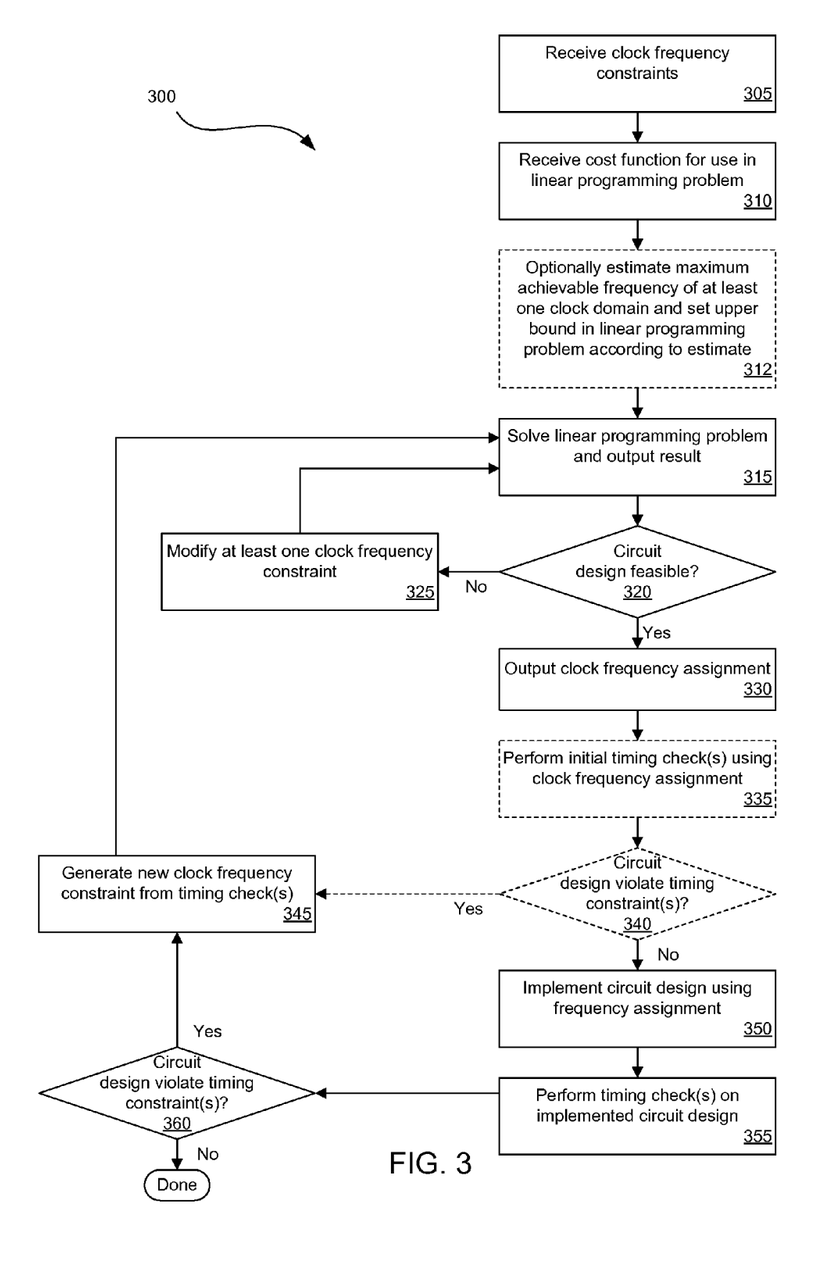
FIG. 3 is a flow chart illustrating a method of developing a circuit design including multiple clock domains in accordance with another embodiment of the present invention.

FIG. 3 is a flow chart illustrating a method 300 of developing a circuit design including multiple clock domains in accordance with another embodiment of the present invention. More particularly, method 300 can determine whether a circuit design is feasible according to a set of clock frequency constraints and also determine whether the circuit design, using a clock frequency assignment, will meet timing requirements established for different signal paths of the circuit design. Method 300 can be implemented using a system as described with reference to FIGS. 1 and 2.

Accordingly, beginning in step 305, one or more clock frequency constraints can be received. As noted, the clock frequency constraints can be specified as fixed value clock frequency constraints, range clock frequency constraints, and relational expression clock frequency constraints. The clock frequency constraints specify requirements to which the operating frequency of each clock domain of a circuit design being implemented must conform. In step 310, a cost function can be specified that depends upon the various clock frequencies that are to be determined. As noted, the cost function can include a prioritization of the clock domains of the circuit design so that clock domains of higher priority contribute a greater amount to minimization of the cost determined using the cost function, e.g., contribute a smaller value in terms of increasing the value of the cost function.

Step 312 can be an optional step as indicated by the dashed line. Step 312 can be applied to automatically determine one or more constraints for the linear programming formulation. In step 312, the system can implement one or more or each individual clock domain of the circuit design in isolation to estimate the maximum achievable frequency for each clock domain. Based upon such estimation(s), the system can impose one or more upper bounds on clock frequency for those clock domains for which maximum achievable clock frequencies were determined using range constraints in the linear programming formulation of the problem. This step can rule out impossible frequency targets and reduce complexity and/or run time when determining a solution.

In step 315, the linear programming problem, as specified by the clock frequency constraints and the cost function, can be solved. The linear programming problem can be solved by determining a clock frequency assignment that minimizes the cost function and which specifies a clock frequency for each clock domain that does not violate the clock frequency constraints. The result, e.g., the feasibility and/or any clock frequency assignment also can be output.

In step 320, the system can determine whether the circuit design is feasible based upon the solution to the linear programming problem specified. If the circuit design is not feasible, e.g., there is no combination of clock frequencies that satisfies, or does not violate, the clock frequency constraints, the method can proceed to step 325. If the circuit design is feasible, the method can proceed to step 330.

In step 325, when the system determines that the circuit design is not feasible, one or more clock frequency constraints can be modified. More particularly, one or more clock frequency constraints can be relaxed. For example, a relationship clock frequency constraint that specifies that a first clock domain must run at twice the frequency of a second clock domain can be relaxed so that the first clock domain need only run at 1.9 times the frequency of the second clock domain.

By modifying one or more clock frequency constraints so that the clock frequency constraints are less restrictive, the system can present a user with more information than merely indicating that the circuit design was not feasible. For example, the system can continue to relax clock frequency constraints until a feasible circuit design is achieved using the less restrictive clock frequency constraints. At that point, the system can output a clock frequency assignment for the circuit design and also the particular clock frequency constraints that were in place when the feasible clock frequency assignment was determined. This allows a circuit designer to see or obtain a feasible solution, albeit with less restrictive clock frequency constraints than initially specified. It should be appreciated, however, that the system also can output a result simply indicating whether the circuit design is feasible and, if so, a clock frequency assignment.

It should be appreciated that clock frequency constraints can be relaxed while exploring a feasible solution in a fully autonomous manner or in a way that requires user involvement. In an embodiment in which the clock frequency constraints are relaxed autonomously, the system can determine which clock frequency constraint(s) to relax and how to relax those clock frequency constraints based upon a set of pre-defined strategies and acquired knowledge of the circuit design. For example, the system can relax the constraints on a clock domain that has at least a predetermined number of timing violations, has a largest number of timing violations, or that has been determined to have the least likelihood of attaining timing closure (no timing violations). In an interactive exploration in which the user is involved, the system can receive user guidance, e.g., selections, as to which clock frequency constraints to relax and how to relax such clock frequency constraints. This guidance can be given or solicited once, and the system allowed to iterate, or can be obtained on a per iteration basis during the exploration.

Continuing with step 330, in the case where the circuit design is feasible, the clock frequency assignment can be output to a next stage that performs various timing checks upon the circuit design. Steps 335 and 340 can be optional steps as indicated by the dashed lines. Steps 335 and 340 provide a simplified and fast check as to whether a given clock frequency assignment will meet user-specified timing constraints for the circuit design without performing a complete implementation of the circuit design.

In step 335, the system can perform one or more initial timing checks to determine whether the circuit design, using the clock frequency assignment, violates any established timing constraints for the circuit design. For example, the system can perform a timing simulation using established high-level models, e.g., without first performing synthesis, mapping, placing, and/or routing of the circuit design. After performing the initial timing check(s) using the clock frequency assignment, the method can proceed to step 340, where a determination can be made as to whether, at this high level, one or more user-specified timing constraints were violated during the timing check(s). If so, the method can proceed to step 345. If not, the method can proceed to step 350.

In step 345, one or more new clock frequency constraints can be generated according to the timing check(s). In one aspect, a new clock frequency constraint can be generated by creating a completely new clock frequency constraint that did not exist within the prior linear programming problem. In another aspect, a new clock frequency constraint can be generated by modifying an existing clock frequency constraint, e.g., making the clock frequency constraint more restrictive or by relaxing the clock frequency constraint based upon the failed timing check(s).

For example, if the system determines that the clock frequency of clock domain A can only achieve up to 380 MHz under the current clock frequency constraint settings, the system can replace the constraint $f_A=400$ with a range constraint such as $380 \leq f_A \leq 400$. This gives the system some opportunity to search for a feasible solution in the unexplored space of constraint settings. By creating a new clock frequency constraint, a new linear programming problem is effectively generated. Accordingly, method 300 can loop back to step 315 to solve that new linear programming problem and determine whether a feasible solution is achievable.

Continuing with step 350, when the circuit design meets or exceeds the timing requirements as determined from the initial timing checks, the circuit design can be implemented. With respect to programmable ICs, the circuit design can be synthesized, mapped, placed, and routed. In step 355, timing checks can be performed upon the implemented circuit design. In step 360, the system can determine whether the circuit design, as implemented, meets timing, e.g., does not violate, the timing constraints. For example, the timing checks can include testing to determine whether any delays for signal paths within the implemented circuit design are larger than allowable per user-specified timing constraints. Signal paths with delays larger than an applicable timing constraint can be said to be "critical paths." If any critical paths exist, the circuit design can be said to violate the timing constraint(s). In this sense, though the clock frequency assignment was feasible, the circuit design still may not be feasible as the hardware implementation will not meet user-specified timing constraints.

If the circuit design does not violate any timing constraints, the method can end. If the circuit design does violate one or more timing constraints, the method can loop back to step 345, where one or more new clock frequency constraints can be generated, resulting in a reformulated linear programming problem. The method then can continue as described.

It should be appreciated that, while not illustrated in FIG. 3, various checks can be included to prevent excessive run times, excessive iterations, or endless loops. For example, the method can be augmented with checks that exit after a predetermined number of linear programming problems are solved, after a predetermined number of timing checks are performed by the HLMS, after a predetermined number of circuit designs are implemented by the HLMS, or the like. Further, the method can be modified so that a user is provided with a choice as to whether a circuit design will be implemented by the HLMS, e.g., whether the method continues to operate to provide a clock frequency assignment and/or implementation option for a circuit design when the initial linear programming problem indicates that the circuit design is infeasible.

As noted, method 300 can be performed by a unified system that includes LP solving capability and HLMS functionality or by an LPS and an HLMS working in cooperation. Thus, steps 305-330 can be performed by an LPS or a module that performs such functions. Steps 335-360 can be performed by an HLMS or a module that performs such functions.

The flowchart in the figures illustrates the architecture, functionality, and operation of possible implementations of systems, methods and computer program products according to various embodiments of the present invention. In this regard, each block in the flowchart may represent a module, segment, or portion of code, which comprises one or more portions of computer-usable program code that implements the specified logical function(s).

It should be noted that, in some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It also should be noted that each block of the flowchart illustration, and combinations of blocks in the flowchart illustration, can be implemented by special purpose hardware-based systems that perform the specified functions or acts, or combinations of special purpose hardware and computer instructions.

Embodiments of the present invention can be realized in hardware, software, or a combination of hardware and software. The embodiments can be realized in a centralized fashion in one data processing system or in a distributed fashion where different elements are spread across several interconnected data processing systems. Any kind of data processing system or other apparatus adapted for carrying out the methods described herein is suited. A typical combination of hardware and software can be a general-purpose computer system with a computer program that, when being loaded and executed, controls the computer system such that it carries out the methods described herein.

A "computer," e.g., a data processing system or a computer system, suitable for storing and/or executing program code will include at least one processor coupled directly or indirectly to memory elements through a system bus. The memory elements can include local memory employed during actual execution of the program code, bulk storage, and cache memories which provide temporary storage of at least some program code in order to reduce the number of times code must be retrieved from bulk storage during execution.

Input/output or I/O devices such as, for example, keyboards, displays, pointing devices, etc., can be coupled to the computer either directly or through intervening I/O controllers. Network adapters may also be coupled to the computer to enable the computer to become coupled to other computers, devices, or remote printers or storage devices through intervening private or public networks. Modems, cable modems, and Ethernet cards are just a few of the currently available types of network adapters.

Embodiments of the present invention further can be embedded in a computer program product, which comprises all the features enabling the implementation of the methods described herein. The computer program product can include a computer-usable or computer-readable medium having computer-usable program code which, when loaded in a computer system, causes the computer system to perform the functions described herein. Examples of computer-usable or computer-readable media can include, but are not limited to, optical media, magnetic media, computer memory, one or more portions of a wired or wireless network through which computer-usable program code can be propagated, or the like.

The terms "computer program," "software," "application," "computer-usable program code," variants and/or combinations thereof, in the present context, mean any expression, in any language, code or notation, of a set of instructions intended to cause a system having an information processing capability to perform a particular function either directly or after either or both of the following: a) conversion to another language, code or notation; b) reproduction in a different material form. For example, a computer program can include, but is not limited to, a subroutine, a function, a procedure, an object method, an object implementation, an executable application, an applet, a servlet, a source code, an object code, a shared library/dynamic load library and/or other sequence of instructions designed for execution on a computer system.

The terms "a" and "an," as used herein, are defined as one or more than one. The term "plurality," as used herein, is defined as two or more than two. The term "another," as used herein, is defined as at least a second or more. The terms "including" and/or "having," as used herein, are defined as comprising, i.e., open language. The term "coupled," as used herein, is defined as connected, although not necessarily directly, and not necessarily mechanically, e.g., communicatively linked through a communication channel or pathway or another component or system.

The embodiments disclosed herein can be embodied in other forms without departing from the spirit or essential attributes thereof. Accordingly, reference should be made to the following claims, rather than to the foregoing specification, as indicating the scope of the various embodiments of the present invention.

What is claimed is:

1. A method of circuit design comprising:
   receiving clock frequency constraints defining relationships between clock frequencies of a plurality of clock domains of a circuit design specified within a high-level modeling system;
   receiving a cost function that is dependent upon the clock frequencies of the plurality of clock domains;
   determining, by a computer, a feasibility result according to the clock frequency constraints and the cost function, wherein the feasibility result indicates whether a clock frequency assignment exists that specifies a clock frequency for each of the plurality of clock domains that does not violate any clock frequency constraint;
   outputting the feasibility result;
   in response to the feasibility result indicating that the circuit design is not feasible, performing steps including:
      selecting one of the plurality of clock domains based on respective numbers of timing violations of the plurality of clock domains;
      modifying the clock frequency constraint of the one clock domain; and
      determining a feasibility result according to the clock frequency constraints, inclusive of the modified clock frequency constraint, and the cost function;
   responsive to the feasibility result indicating that the circuit design is feasible, determining a clock frequency assignment specifying a clock frequency for each of the plurality of clock domains;
   performing a timing check on the circuit design; and
   responsive to determining that the circuit design does not meet at least one timing constraint, generating a new clock frequency constraint according to a result from the timing check.

2. The method of claim 1, further comprising selecting at least one clock frequency constraint to specify an allowable clock frequency range for at least one of the clock domains.

3. The method of claim 2, further comprising selecting the clock frequency range to be a closed frequency range.

4. The method of claim 2, further comprising selecting the clock frequency range to be an open frequency range.

5. The method of claim 1, further comprising selecting at least one clock frequency constraint to specify an inter-clock domain dependency for clock frequencies of at least two of the plurality of clock domains.

6. The method of claim 1, wherein the feasibility result indicates that the circuit design is feasible, the method further comprising:
determining a clock frequency assignment specifying a clock frequency for each of the plurality of clock domains; and
outputting the clock frequency assignment.

7. The method of claim 6, further comprising determining whether the circuit design meets at least one timing constraint.

8. The method of claim 6, further comprising:
implementing the circuit design; and
determining whether the implemented circuit design meets at least one timing constraint.

9. The method of claim 6, further comprising:
performing a timing check on the circuit design and determining that the circuit design does not meet at least one timing constraint;
determining at least one new clock frequency constraint according to a result from the timing check; and
determining feasibility of the circuit design using the clock frequency constraints, inclusive of the new clock frequency constraint, and the cost function.

10. The method of claim 1, further comprising defining the cost function to specify a priority among the plurality of clock domains.

11. The method of claim 1, wherein determining a feasibility result comprises solving a linear problem defined by the clock frequency constraints and the cost function by minimizing the cost function.

12. The method of claim 1, further comprising:
first implementing at least one clock domain to determine a maximum achievable clock frequency for at least one clock domain of the circuit design; and
automatically generating at least one of the clock frequency constraints as an upper bound clock frequency constraint according to the maximum achievable clock frequency of the at least one clock domain.

13. A method of circuit design comprising:
receiving clock frequency constraints for a plurality of clock domains of a circuit design, wherein the clock frequency constraints specify a linear programming problem defining inter-dependencies among clock frequencies of the plurality of clock domains;
determining, by a computer, a solution for the linear programming problem, wherein the solution indicates a feasibility result of the circuit design according to whether a frequency exists for each of the plurality of clock domains that does not violate any of the clock frequency constraints;
outputting an indication of feasibility of the circuit design;
in response to the feasibility result indicating that the circuit design is not feasible, performing steps including:
selecting one of the plurality of clock domains based on respective numbers of timing violations of the plurality of clock domains;
modifying the clock frequency constraint of the one clock domain; and
determining a feasibility result according to the clock frequency constraints, inclusive of the modified clock frequency constraint;
responsive to the feasibility result indicating that the circuit design is feasible, determining a clock frequency assignment specifying a clock frequency for each of the plurality of clock domains;
performing a timing check on the circuit design; and
responsive to determining that the circuit design does not meet at least one timing constraint, generating a new clock frequency constraint according to a result from the timing check.

14. The method of claim 13, further comprising determining whether clock frequencies calculated when determining a solution for the linear programming problem violate timing constraints for the circuit design, wherein feasibility of the circuit design depends upon whether the solution for the linear programming problem violates the timing constraints.

15. The method of claim 13, wherein solving the linear programming problem further comprises minimizing a cost function that depends upon the clock frequency constraints.

16. The method of claim 15, further comprising assigning priorities among the clock domains within the cost function, wherein each clock domain contributes to a cost determined using the cost function according to the priority assigned to that clock domain.

17. A computer program product comprising:
a non-transitory computer-usable medium comprising computer-usable program code that implements a method of circuit design, the computer-usable medium comprising:
computer-usable program code that receives clock frequency constraints defining relationships between clock frequencies of a plurality of clock domains of a circuit design specified within a high-level modeling system;
computer-usable program code that receives a cost function that is dependent upon the clock frequencies of the plurality of clock domains;
computer-usable program code that determines a feasibility result according to the clock frequency constraints and the cost function, wherein the feasibility result indicates whether a clock frequency assignment exists that specifies a clock frequency for each of the plurality of clock domains that does not violate any clock frequency constraint;
computer-usable program code that outputs the feasibility result;
computer-usable program code that, responsive to the feasibility result indicating that the circuit design is not feasible, performing steps including:
selects one of the plurality of clock domains based on respective numbers of timing violations of the plurality of clock domains;
modifies the clock frequency constraint of the one clock domain; and
determines a feasibility result according to the clock frequency constraints, inclusive of the modified clock frequency constraint, and the cost function;
computer-usable program code that, responsive to the feasibility result indicating that the circuit design is feasible, determines a clock frequency assignment specifying a clock frequency for each of the plurality of clock domains;
computer-usable program code that performs a timing check on the circuit design; and
computer-usable program code that, responsive to determining that the circuit design does not meet at least one timing constraint, generates a new clock frequency constraint according to a result from the timing check.

18. The computer program product of claim 17, wherein the feasibility result indicates that the circuit design is feasible, the computer-usable medium further comprising:
   computer-usable program code that determines a clock frequency assignment specifying a clock frequency for each of the plurality of clock domains; and
   computer-usable program code that outputs the clock frequency assignment.

19. The computer program product of claim 17, wherein the computer-usable program code that receives a cost function further comprises computer-usable program code that defines the cost function to specify a priority among the plurality of clock domains.

\* \* \* \* \*